(12) United States Patent
Ho

(10) Patent No.: US 11,178,774 B1
(45) Date of Patent: Nov. 16, 2021

(54) METHOD FOR MANUFACTURING CIRCUIT BOARD

(71) Applicant: Chung W. Ho, Taipei (TW)

(72) Inventor: Chung W. Ho, Taipei (TW)

( * ) Notice: Subject to any disclaimer, the term of this patent is extended or adjusted under 35 U.S.C. 154(b) by 0 days.

(21) Appl. No.: 17/209,236

(22) Filed: Mar. 23, 2021

(51) Int. Cl.
*H05K 3/10* (2006.01)
*H05K 3/00* (2006.01)

(52) U.S. Cl.
CPC ............... *H05K 3/10* (2013.01); *H05K 3/00* (2013.01)

(58) Field of Classification Search
CPC ............................. H05K 3/10; H05K 3/0011
See application file for complete search history.

(56) References Cited

U.S. PATENT DOCUMENTS

| | | | | |
|---|---|---|---|---|
| 7,223,687 B1 * | 5/2007 | Ho | ............ | H05K 3/0058 29/829 |
| 7,716,826 B2 * | 5/2010 | Nakamura | ............ | H05K 3/3473 29/846 |
| 9,763,332 B2 * | 9/2017 | Kobayashi | ............ | H05K 3/4682 |
| 10,201,099 B1 * | 2/2019 | Ho | ............ | H05K 3/4038 |
| 2005/0155222 A1 * | 7/2005 | Nakamura | ............ | H05K 3/4682 29/830 |

FOREIGN PATENT DOCUMENTS

TW 202018789 5/2020

* cited by examiner

*Primary Examiner* — Minh N Trinh
(74) *Attorney, Agent, or Firm* — JCIPRNET

(57) ABSTRACT

A manufacturing method of a circuit board is provided. A first carrier board included a substrate and a first conductive layer is provided, and the first conductive layer is located on a first surface of the substrate. A stainless steel layer is sputtered on the first conductive layer. An insulating layer is formed to cover a peripheral region of the stainless steel layer and expose a central region. A circuit structure layer is formed on the central region exposed by the insulating layer. A bottom surface of the circuit structure layer is connected to the first carrier board. A transferring procedure is performed to adhere a top surface of the circuit structure layer onto an adhesive layer of a second carrier board. The first carrier board is separated with the circuit structure layer to transfer the circuit structure layer onto the second carrier board, and expose the bottom surface of the circuit structure layer. The manufacturing method of the circuit board of the present invention is safer and simpler, may effectively reduce the manufacturing costs and improve the product yields.

12 Claims, 9 Drawing Sheets

METHOD FOR MANUFACTURING CIRCUIT BOARD

TECHNICAL FIELD

The invention relates to a method for manufacturing a board, and particularly to a method for manufacturing a circuit board.

DESCRIPTION OF RELATED ART

In the well-known coreless manufacturing process, part of the edge of the carrier board and part of the edge of the circuit board are first bonded with adhesive or copper-plated edge sealing. In another convention, a thin substrate (with a thickness of 100 μm, for example) containing a glass fiber cloth and, on each of both sides, being adhered with a piece of copper foil and a peelable ultra-thin copper foil (with a thickness of 3 μm to 5 μm, for example) attached thereon is employed as a carrier board. After the circuit board undergoes several processes, the part with adhesive or copper-plated edge sealing between the carrier board and the circuit board is cut off to obtain the circuit board for packaging process. However, in the well-known coreless manufacturing process, since some of the carrier board and some of the circuit board require to be cut off, the size of the circuit board may be reduced and the cut-off carrier board cannot be reused, resulting in increased manufacturing costs.

In order to solve the above problems, conventionally, a stainless steel board is employed as the base of the carrier. In the manufacturing process of the circuit structure, in addition to providing good stability, the stainless steel board does not require cutting during board separation, and may thus be reused, thereby effectively saving the manufacturing costs. However, since the stainless steel board is of a large volume and a heavy weight, during the manufacturing process, transportation may often be difficult. Moreover, edges and corners thereof are relatively sharp, often causing damage to the substrate per se or the machine.

SUMMARY

The invention provides a method for manufacturing a circuit board, which is safer and simpler in terms of manufacturing, may effectively reduce manufacturing costs and improve product yields.

The method for manufacturing a circuit board of the invention includes the following steps. A first carrier board having a substrate and a first conductive layer is provided. The substrate has a first surface, and the first conductive layer is located on the first surface. A stainless steel layer is sputtered on the first conductive layer. The stainless steel layer has a central region and a peripheral region surrounding the central region. An insulating layer is formed to cover the peripheral region of the stainless steel layer. The insulating layer extends from an upper surface of the stainless steel layer and covers a side of the stainless steel layer and a side of the first carrier board. The insulating layer exposes the central region. A circuit structure layer is formed on the central region exposed by the insulating layer. The circuit structure layer has a top surface and a bottom surface opposite to each other, and the bottom surface is connected to the first carrier board. The first conductive layer of the first carrier board and an interface of the stainless steel layer are separated to separate the first carrier board and the circuit structure layer.

In an embodiment of the invention, the method for manufacturing a circuit board also includes the following. A transferring procedure is performed after the circuit structure layer is formed on the central region exposed by the insulating layer to adhere the top surface of the circuit structure layer onto an adhesive layer of a second carrier board. The circuit structure layer is located between the first carrier board and the second carrier board. The first carrier board and the circuit structure layer are separated to transfer the circuit structure layer onto the second carrier board, and expose the bottom surface of the circuit structure layer.

In an embodiment of the invention, a material of the substrate includes a sheet-shaped or a roll-shaped glass fiber resin substrate or a roll-shaped stainless steel substrate.

In an embodiment of the invention, the first carrier board further includes a second conductive layer. The substrate has a second surface opposite to the first surface, and the second conductive layer is located on the second surface. A material of the first conductive layer and the second conductive layer respectively included a copper foil.

In an embodiment of the invention, a shape of the substrate includes a sheet shape or a roll shape.

In an embodiment of the invention, the substrate is a glass substrate. The first carrier board further includes the second conductive layer, and the second conductive layer is located between the first conductive layer and the substrate. A material of the first conductive layer includes a copper, and a material of the second conductive layer includes a titanium.

In an embodiment of the invention, the method for manufacturing a circuit board further includes the following. A metal layer is formed on the central region of the stainless steel layer after the insulating layer is formed to cover the peripheral region of the stainless steel layer and before the circuit structure layer is formed on the central region exposed by the insulating layer.

In an embodiment of the invention, the step of forming the circuit structure layer on the central region exposed by the insulating layer includes the following. A first patterned circuit layer is formed on the metal layer. The first patterned circuit layer exposes part of the metal layer. A first solder mask layer is formed on the first patterned circuit layer. The first solder mask layer covers the metal layer and the first patterned circuit layer and has multiple first openings. The first openings expose part of the first patterned circuit layer. A first surface-treated layer is formed on the first patterned circuit layer exposed by the first openings.

In an embodiment of the invention, the method for manufacturing a circuit board further includes the following. The metal layer is removed to expose the bottom surface of the circuit structure layer after the first carrier board and the circuit structure layer are separated. A second solder mask layer is formed on the bottom surface of the circuit structure layer. The second solder mask layer covers the first solder mask layer and the first patterned circuit layer and has multiple second openings, and the second openings expose part of the first patterned circuit layer. A second surface-treated layer is formed on the first patterned circuit layer exposed by the second openings.

In an embodiment of the invention, the step of forming the circuit structure layer on the central region exposed by the insulating layer includes the following. The first patterned circuit layer is formed on the metal layer, and the first patterned circuit layer exposes part of the metal layer. A dielectric layer is formed on the first patterned circuit layer. The dielectric layer covers the metal layer and the first patterned circuit layer. The dielectric layer has multiple openings, and the openings expose part of the first patterned circuit layer. Multiple conductive through holes and a second patterned circuit layer are formed on the dielectric layer. The conductive through holes are located in the openings, and the second patterned circuit layer is located on the dielectric layer. The second patterned circuit layer is electrically connected to the first patterned circuit layer through the conductive through holes. The first solder mask layer is formed on the second patterned circuit layer. The first solder mask layer covers the dielectric layer and the second patterned circuit layer and has multiple first openings. The first openings expose part of the second patterned circuit layer. The first surface-treated layer is formed on the second patterned circuit layer exposed by the first openings.

In an embodiment of the invention, the method for manufacturing a circuit board further includes the following. The metal layer is removed to expose the bottom surface of the circuit structure layer after the first carrier board and the circuit structure layer are separated. The second solder mask layer is formed on the bottom surface of the circuit structure layer. The second solder mask layer covers the dielectric layer and the first patterned circuit layer and has multiple second openings. The second openings expose part of the first patterned circuit layer. The second surface-treated layer is formed on the first patterned circuit layer exposed by the second openings.

In an embodiment of the invention, a thickness of the stainless steel layer is between 0.05 μm and 0.5 μm.

Based on the foregoing, in the method for manufacturing a circuit board of the invention, the stainless steel layer is formed on the first conductive layer of the first carrier board by sputtering to achieve the effect of separation between the manufactured product board and the carrier board with the separability property between the stainless steel layer and the metal layer thereon. Moreover, the stainless steel layer formed by sputtering is of a less size and weight compared to the conventional stainless steel board. In addition, it may be safer and simpler to apply the conventional glass fiber resin substrate in terms of operation. Besides, since cutting is not required when separating the first carrier board and the circuit structure layer, the first carrier board may be reused, thereby effectively saving the manufacturing costs. In short, the method for manufacturing a circuit board is safer and simpler in terms of manufacturing, may effectively reduce the manufacturing costs and improve the product yields.

To make the aforementioned features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
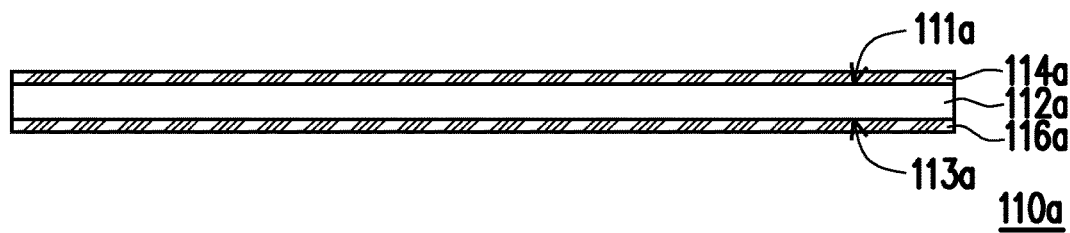
FIG. 1A to FIG. 1I are schematic cross-sectional views of a method for manufacturing a circuit board of an embodiment of the invention.

Reference will now be made in detail to the exemplary embodiments of the invention, examples of which are illustrated in the accompanying drawings. Wherever possible, the same element symbols are used in the drawings and description to represent the same or similar parts.

FIG. 1A to FIG. 1I are schematic cross-sectional views of a method for manufacturing a circuit board of an embodiment of the invention. Regarding the manufacturing method of the circuit board of this embodiment, first, referring to FIG. 1A, a first carrier board 110a having a substrate 112a and a first conductive layer 114a is provided. The substrate 112a has a first surface 111a, and the first conductive layer 114a is located on the first surface 111a. In this embodiment, the first carrier board 110a further includes a second conductive layer 116a. The substrate 112a has a second surface 113a opposite to the first surface 111a, and the second conductive layer 116a is located on the second surface 113a. Herein, a material of the substrate 112a is, for example, a sheet-shaped glass fiber resin substrate, and a material of the first conductive layer 114a and the second conductive layer 116a is respectively, for example, a copper foil. The first carrier board 110a may then be regarded as a core substrate. In another embodiment, the material of the substrate 112a may also be a roll-shaped glass fiber resin substrate, and the first carrier board 110a may then be regarded as a flexible copper clad laminate (FCCL). In yet another embodiment, the substrate may also be a roll-shaped stainless steel substrate. In other words, the carrier board in this embodiment may be a hard board (i.e., the core substrate) or a flexible board (i.e., the flexible copper clad laminate or the stainless steel substrate).

Figure 1B:
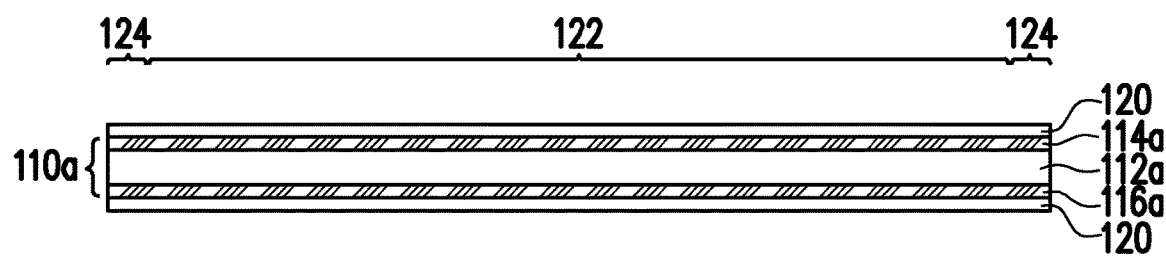

Next, referring to FIG. 1B, a stainless steel layer 120 is sputtered on the first conductive layer 114a and the second conductive layer 116a of the first carrier board 110a. The stainless steel layer 120 has a central region 122 and a peripheral region 124 surrounding the central region 122. For a material of the stainless steel layer 120, for example, SUS 304, any other suitable model, and the like is used. A thickness of the stainless steel layer 120 is, for example, between 0.05 μm and 0.5 μm. In other words, the stainless steel layer 120 may be regarded as a stainless steel film.

Figure 1C:
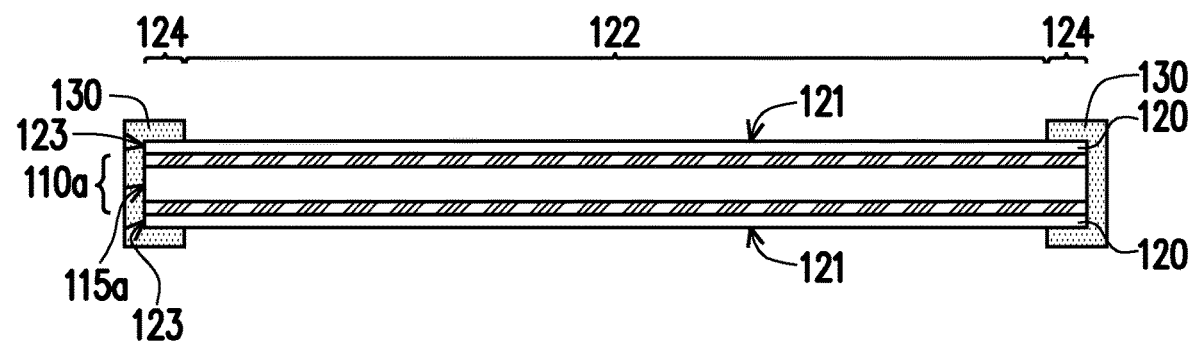

Next, referring to FIG. 1C, an insulating layer 130 is formed to cover the peripheral region 124 of the stainless steel layer 120. The insulating layer 130 extends from an upper surface 121 of the stainless steel layer 120 and covers a side 123 of the stainless steel layer 120 and a side 115a of the first carrier board 110a. That is, the insulating layer 130 covers the entire side 115a of the first carrier board 110a and the side 123 of the stainless steel layer 120 and extends to part of the upper surface 121 of the stainless steel layer 120. Herein, the insulating layer 130 only exposes the central region 122 of the stainless steel layer 120. A material of the insulating layer 130 may be a solder mask material or other insulating materials, such as polytetrafluoroethylene (PTFE) epoxy resin, acrylic or derivative composite materials thereof. A thickness of the insulating layer 130 is, for example, 10 μm, but is not limited thereto.

Figure 1D:
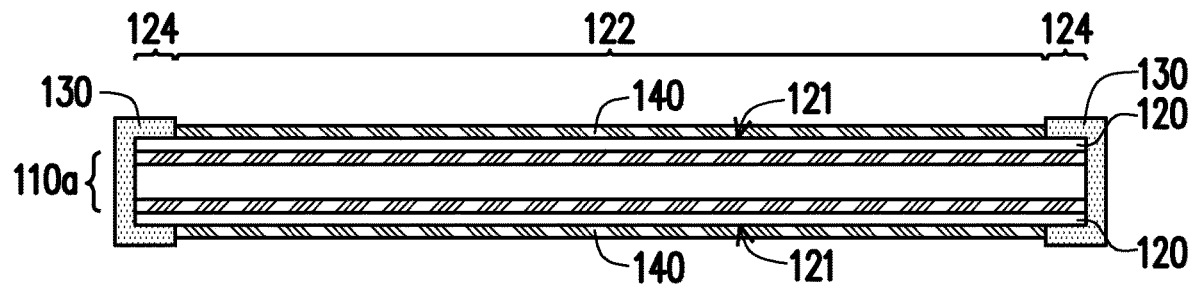

Next, referring to FIG. 1D, a metal layer 140 is symmetrically formed on the central region 122 of the stainless steel layer 120. The metal layer 140 covers part of the upper surface 121 of the stainless steel layer 120. Herein, the metal layer 140 is, for example, formed on the stainless steel layer 120 by electroplating. A material of the metal layer is, for example, a copper, but is not limited thereto.

Figure 1E:
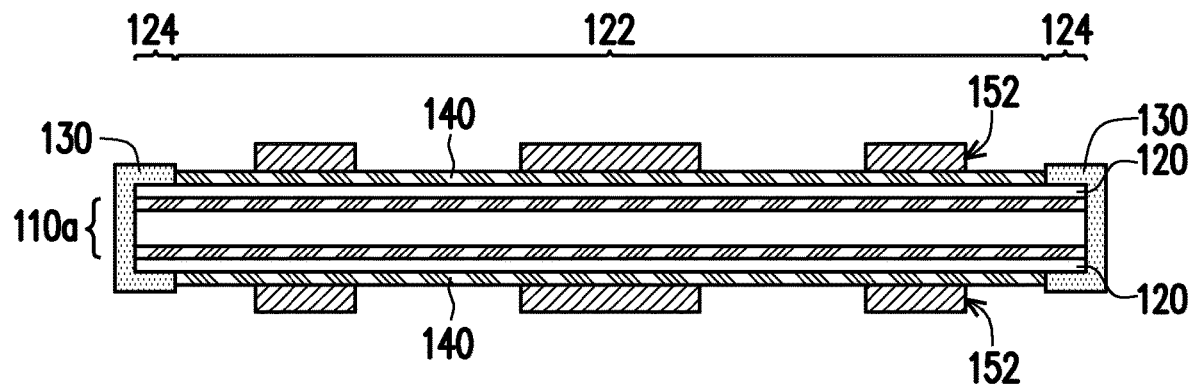
Figure 1F:
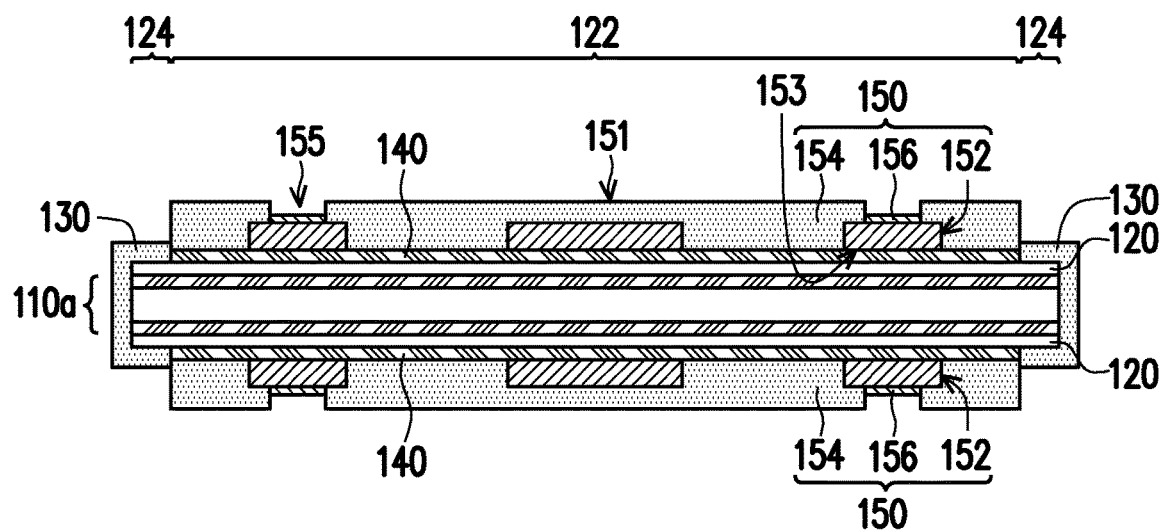

Next, referring to FIG. 1F first, a circuit structure layer 150 is symmetrically formed on the central region 122 exposed by the insulating layer 130. The circuit structure layer 150 has a top surface 151 and a bottom surface 153 opposite to each other, and the bottom surface 153 is connected to the first carrier board 110a. Specifically, the step of forming the circuit structure layer 150 on the central region 122 exposed by the insulating layer 130 includes the following. Referring to FIG. 1E, a first patterned circuit layer 152 is formed on the metal layer 140. The first patterned circuit layer 152 exposes part of the metal layer 140. For example, a semi-additive process (SAP) may be used to form the first patterned circuit layer 152 to meet the requirement of high wiring density. Herein, a thickness of the first patterned circuit layer 152 is, for example, 10 μm, but is not limited thereto.

Next, referring to FIG. 1F again, a first solder mask layer 154 is formed on the first patterned circuit layer 152. The first solder mask layer 154 covers the metal layer 140 and the first patterned circuit layer 152 and has multiple first openings 155. The first openings 155 expose part of the first patterned circuit layer 152. Then, a first surface-treated layer 156 is formed on the first patterned circuit layer 152 exposed by the first openings 155. For example, the first surface-treated layer 156 may include electroless nickel immersion gold, Organic Solderability Preservative (OSP) or other suitable materials, and oxidation of a surface of the first patterned circuit layer 152 may be prevented. So far, the manufacturing of the circuit structure layer 150 has been completed.

Figure 1G:
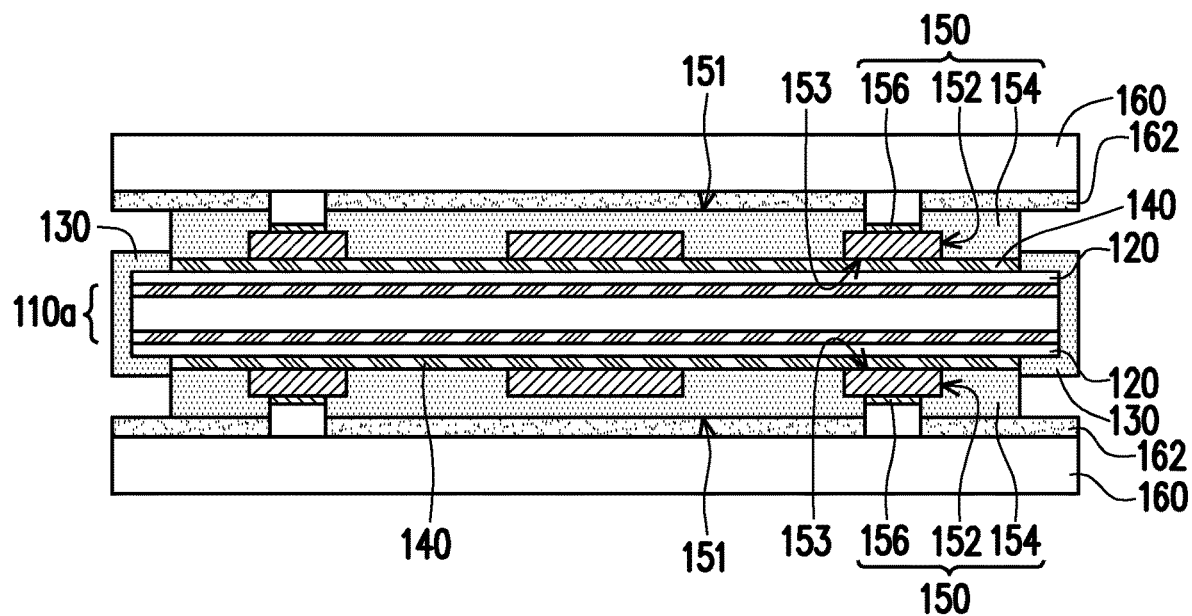

Next, referring to FIG. 1G, a transferring procedure is performed to adhere the top surface 151 of the circuit structure layer 150 onto an adhesive layer 162 of a second carrier board 160. At this time, the circuit structure layer 150 is located between the first carrier board 110a and the second carrier board 160. For example, after the manufacturing of the circuit structure layer 150 is completed, the first carrier board 110a is aligned with the second carrier board 160, so that an orthographic projection area of the circuit structure layer 150 on the second carrier board 160 overlaps with an orthographic projection area of the adhesion layer 162 on the second carrier board 160. Next, the circuit structure layer 150 on the first carrier board 110a is adhered to the adhesion layer 162. The solder mask layer 154 of the circuit structure layer 150 is directly contacted to the adhesion layer 162, so that the adhesion layer 162 on the second carrier board 160 is completely combined with the circuit structure layer 150 on the first carrier board 110a. At this time, a bonding force between the top surface 151 of the circuit structure layer 150 and the second carrier board 160 is greater than the bonding force between the bottom surface 153 of the circuit structure layer 150 and the first carrier board 110a. Herein, a material of the second carrier board 160 is, for example, a core substrate of glass fiber resin, a polyimide (PI) substrate or a Polyethylene Terephthalate (PET) substrate, but is not limited thereto.

Figure 1H:
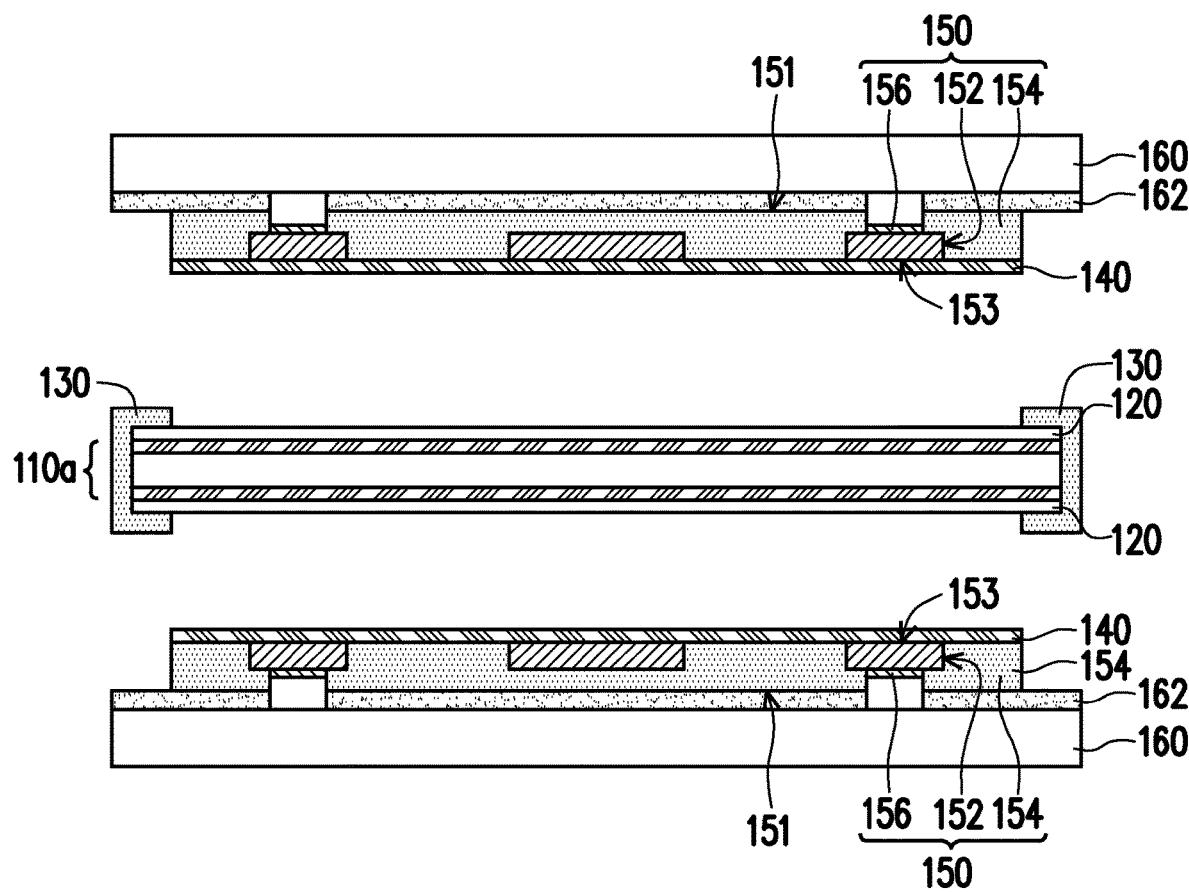

After that, referring to FIG. 1H, the first carrier board 110a and the circuit structure layer 150 are separated to transfer the circuit structure layer 150 onto the second carrier board 160, and the metal layer 140 on the bottom surface 153 of the circuit structure layer 150 is exposed. For example, the second carrier board 160 in a laminated composite board as shown in FIG. 1G is placed downward on a vacuum platform (not shown), and the second carrier board 160 and the circuit structure layer 150 are held firmly by a vacuum. In addition, the second carrier board 160 is fixed by a mechanism, and is separated from the metal layer 140 formed on the first carrier board 110a along a side surface of the insulating layer 130 and an interface of the stainless steel layer 120. Compared with the conventional method of separating the carrier board, the first carrier board 110a of this embodiment does not require cutting, and may thus be reused, thereby effectively saving manufacturing costs.

Figure 1I:
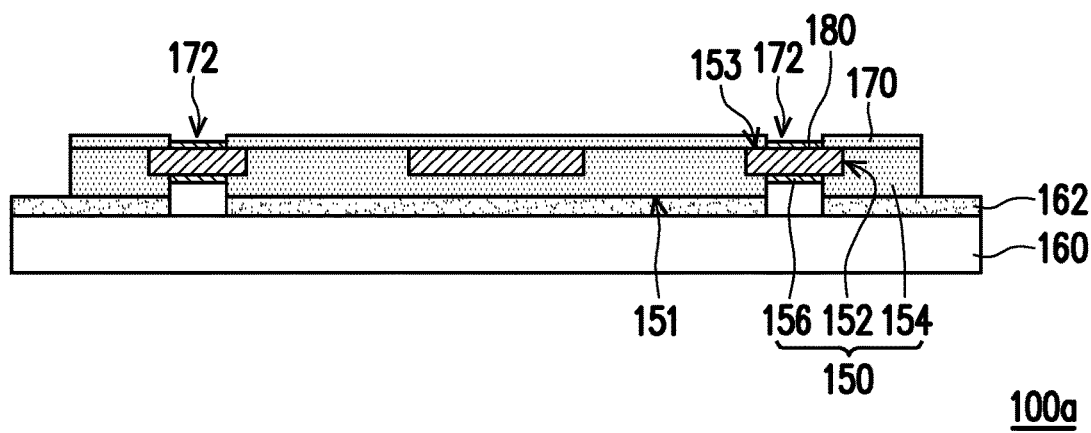

Then, referring to FIGS. 1H and 1I together, the metal layer 140 is removed to expose the bottom surface 153 of the circuit structure layer 150. Herein, the metal layer 140 may be removed by etching, but is not limited thereto. Next, a second solder mask layer 170 is formed on the bottom surface 153 of the circuit structure layer 150. The second solder mask layer 170 covers the first solder mask layer 154 and the first patterned circuit layer 152 and has multiple second openings 172. The second openings 172 expose part of the first patterned circuit layer 152. Finally, a second surface-treated layer 180 is formed on the second patterned circuit layer 152 exposed by the second openings 172. So far, the manufacturing of a circuit board 100a has been completed.

In terms of structure, referring to FIG. 1I again, the circuit board 100a of this embodiment is a single-layer ultra-thin board, that is, the circuit structure layer 150 has only a single circuit layer (i.e., the first patterned circuit layer 152). In this embodiment, the circuit structure layer 150 is adhered to the second carrier board 160 through the adhesion layer 162, but in application of other embodiments, the second carrier board 160 and the adhesion layer 162 may also be removed, so that the circuit board 100a includes the circuit structure layer 150 and the second solder mask layer 170 and the second surface-treated layer 180 thereon, which still belongs to the intended protection scope of the invention.

In the manufacturing method of the circuit board 100a of this embodiment, the stainless steel layer 120 is formed on the first conductive layer 112a of the first carrier board 110a by sputtering. Therefore, during the manufacturing process of the circuit structure layer 150, good stability may be provided. Furthermore, the stainless steel layer 120 formed by sputtering may be of a less size and weight compared to the conventional stainless steel board, and may be safer and simpler in terms of operation. Besides, since cutting is not required when separating the first carrier board 110a and the circuit structure layer 150, the first carrier board 110a may be reused, thereby effectively saving the manufacturing costs. In addition, the manufacturing method of the circuit board 100a of the embodiment may form two circuit boards 100a at the same time, which may improve the production efficiency. Briefly speaking, the manufacturing method of the circuit board of the present invention is safer and simpler in terms of manufacturing, and may effectively reduce the manufacturing costs and improve product yields.

FIG. 2A to FIG. 2D are schematic cross-sectional views of part of steps of a method for manufacturing a circuit board of another embodiment of the invention. The reference numerals and part of the content of the above embodiments remain to be used in this embodiment, where the same reference numerals are adopted to represent the same or similar elements, and the description of the same technical content is omitted.

Figure 2A:
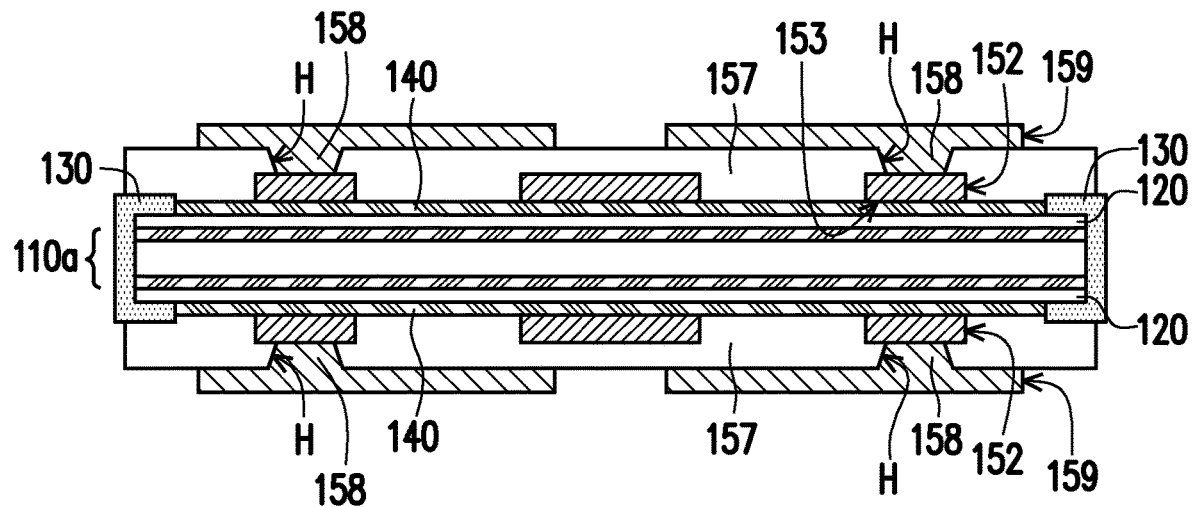
FIG. 2A to FIG. 2D are schematic cross-sectional views of part of steps of a method for manufacturing a circuit board of another embodiment of the invention.

After the step of FIG. 1E, namely after the metal layer 140 is formed on the first patterned circuit layer 152, referring to FIG. 2A, a dielectric layer 157 is formed on the first patterned circuit layer 152. The dielectric layer 157 covers the metal layer 140 and the first patterned circuit layer 152 and has a multiple openings H, and the openings H expose part of the first patterned circuit layer 152. Herein, a material of the dielectric layer 157 is, for example, a photo-imagable dielectric (PID) material, but is not limited thereto.

Next, referring to FIG. 2A again, multiple conductive through holes 158 and a second patterned circuit layer 159 are formed on the dielectric layer 157. The conductive through holes 158 are located in the openings H, and the second patterned circuit layer 159 is located on the dielectric layer 157. The second patterned circuit layer 159 is electrically connected to the first patterned circuit layer 152 through the conductive through holes 158.

Figure 2B:
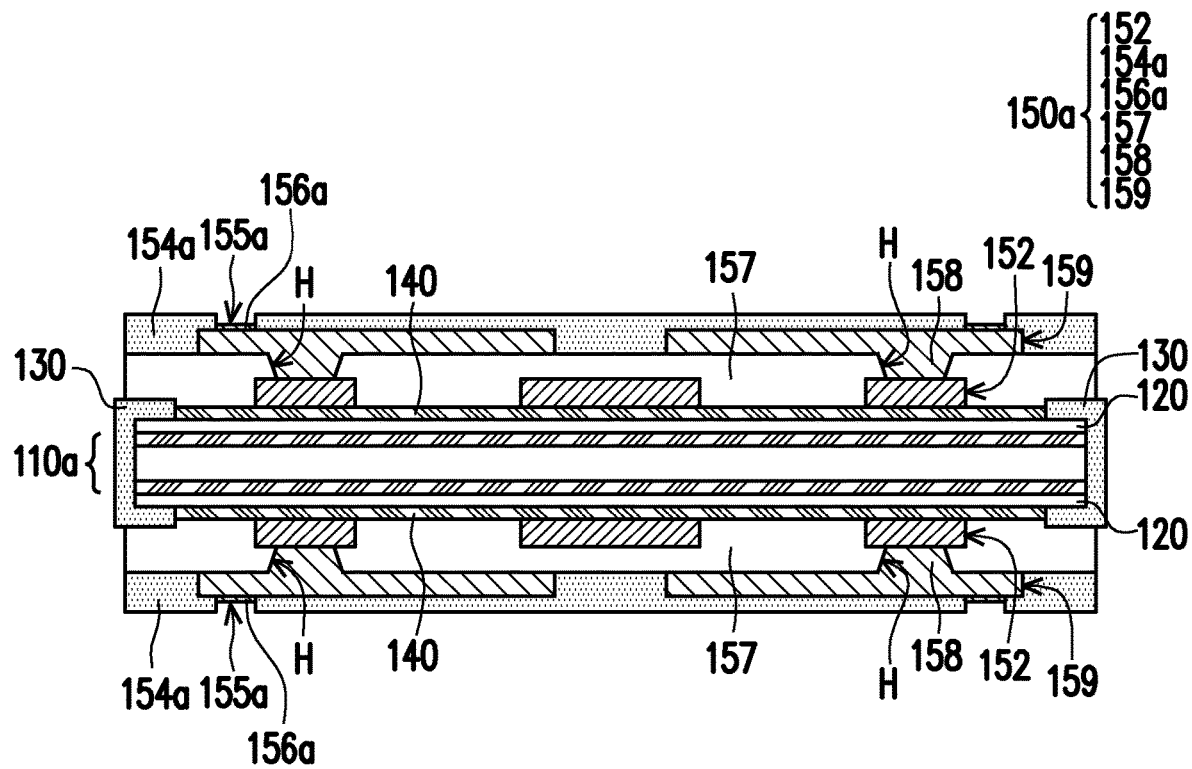

Then, referring to FIG. 2B, a first solder mask layer 154a is formed on the second patterned circuit layer 159. The first solder mask layer 154a covers the dielectric layer 157 and the second patterned circuit layer 159 and has multiple first openings 155a. The first openings 155a expose part of the second patterned circuit layer 159. Next, a first surface-treated layer 156a is formed on the second patterned circuit layer 159 exposed by the first openings 155a. So far, the manufacturing of the circuit structure layer 150 has been completed.

Figure 2C:
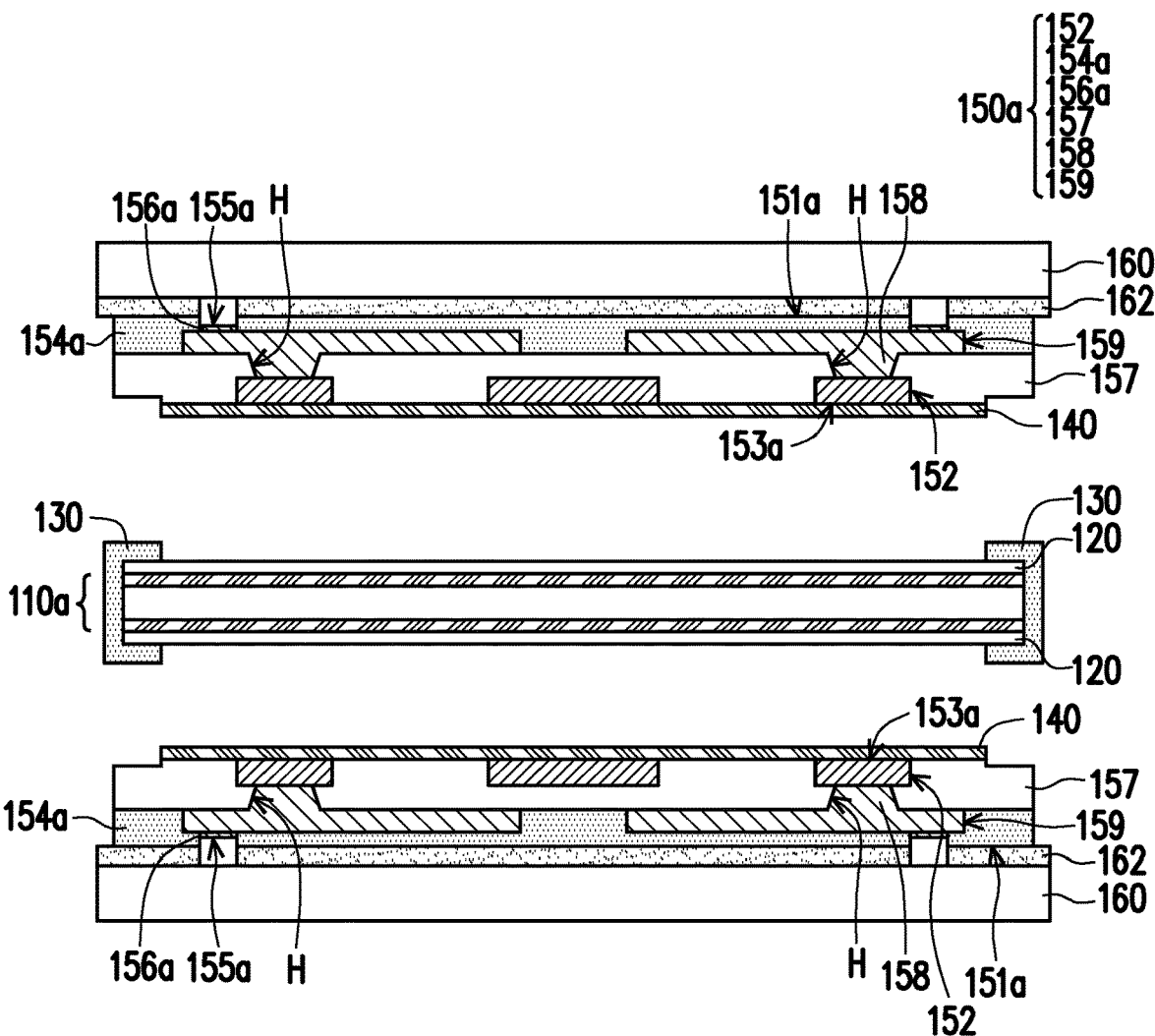

After that, referring to FIG. 2C, the transferring procedure is performed to adhere the top surface 151a of the circuit structure layer 150a onto the adhesive layer 162 of the second carrier board 160. At this time, the circuit structure layer 150a is located between the first carrier board 110a and the second carrier board 160. Next, the first carrier board 110a and the circuit structure layer 150a are separated to transfer the circuit structure layer 150a onto the second carrier board 160, and expose the metal layer 140 on the bottom surface 153a of the circuit structure layer 150a.

Figure 2D:
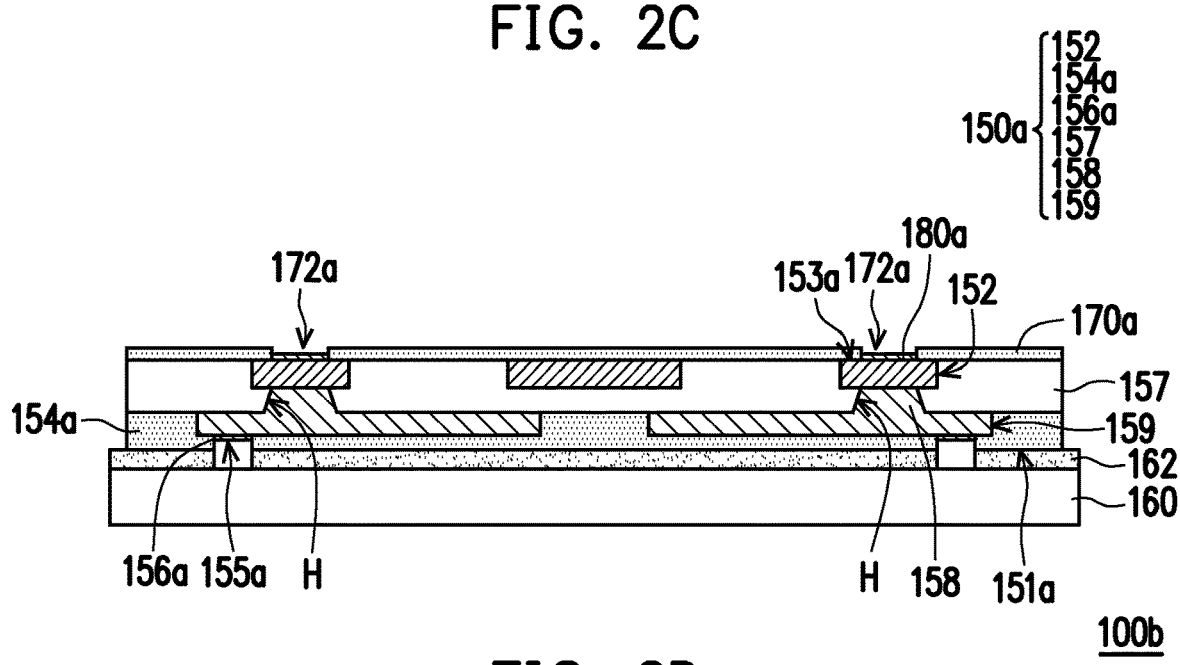

Finally, referring to FIG. 2C and FIG. 2D together, the metal layer 140 is removed to expose the bottom surface 153a of the circuit structure layer 150a. A second solder mask layer 170a is formed on the bottom surface 153a of the circuit structure layer 150a. The second solder mask layer 170a covers the dielectric layer 157 and the first patterned circuit layer 152 and has multiple second openings 172a. The second openings 172a expose part of the first patterned circuit layer 152. A second surface-treated layer 180a is formed on the first patterned circuit layer 152 exposed by the second openings 172a. So far, the manufacturing of a circuit board 100b has been completed.

In terms of structure, referring to FIG. 2D again, the circuit board 100b of this embodiment is a double-layer ultra-thin board, that is, the circuit structure layer 150a has two circuit layers (i.e., the first patterned circuit layer 152 and the second patterned circuit layer 159). In this embodiment, the circuit structure layer 150a is adhered to the second carrier board 160 through the adhesion layer 162, but in application of other embodiments, the second carrier board 160 and the adhesion layer 162 may also be removed, so that the circuit board 100b includes the circuit structure layer 150a and the second solder mask layer 170a and the second surface-treated layer 180a thereon, which still belongs to the intended protection scope of the invention.

In the embodiments, the circuit structure layers 150 and 150a are formed symmetrically on opposite sides of the first carrier board 110a. However, in other embodiments, the circuit structure layer may also be formed on a single side of the first carrier board, which still belongs to the intended scope of the invention.

FIG. 3A to FIG. 3F are schematic cross-sectional views of part of steps of a method for manufacturing a circuit board of another embodiment of the invention. The reference numerals and part of the content of the above embodiments remain to be used in this embodiment, where the same reference numerals are adopted to represent the same or similar elements, and the description of the same technical content is omitted.

Figure 3A:
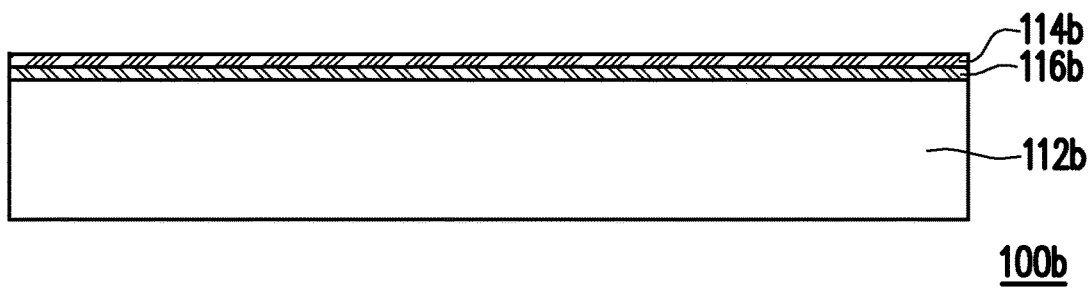
FIG. 3A to FIG. 3F are schematic cross-sectional views of part of steps of a method for manufacturing a circuit board of another embodiment of the invention.

First, referring to FIG. 3A, a first carrier board 110b is provided. The first carrier board 110b includes a substrate 112b and a first conductive layer 114b. The substrate 112b has a first surface 111b, and the first conductive layer 114b is on the first surface 111b. Moreover, the first carrier board 110b further includes a second conductive layer 116b, and the second conductive layer 116b is located between the first conductive layer 114b and the substrate 112b. Herein, the substrate 112b is a glass substrate, a material of the first conductive layer 112b is, for example, a copper, and a material of the second conductive layer 116b is, for example, a titanium.

Figure 3B:
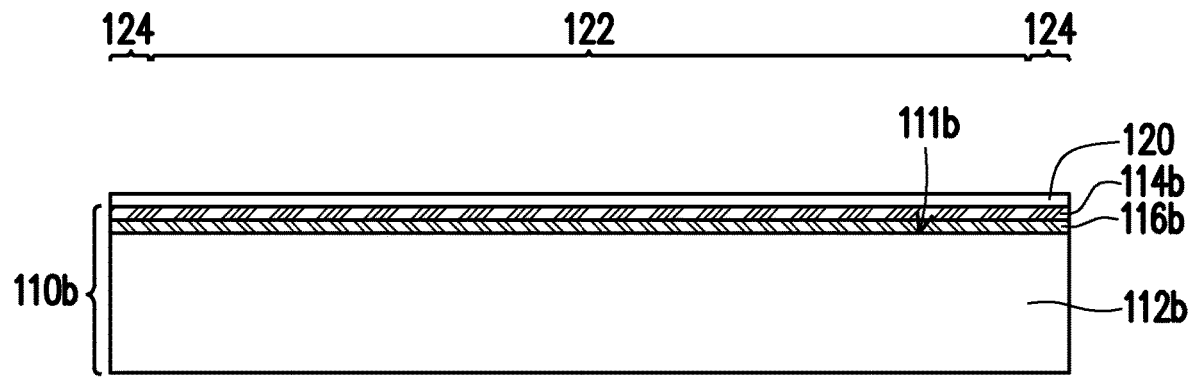

Next, referring to FIG. 3B, the stainless steel layer 120 is sputtered on the first conductive layer 114b of the first carrier board 110b. The stainless steel layer 120 has the central region 122 and the peripheral region 124 surrounding the central region 122.

Figure 3C:
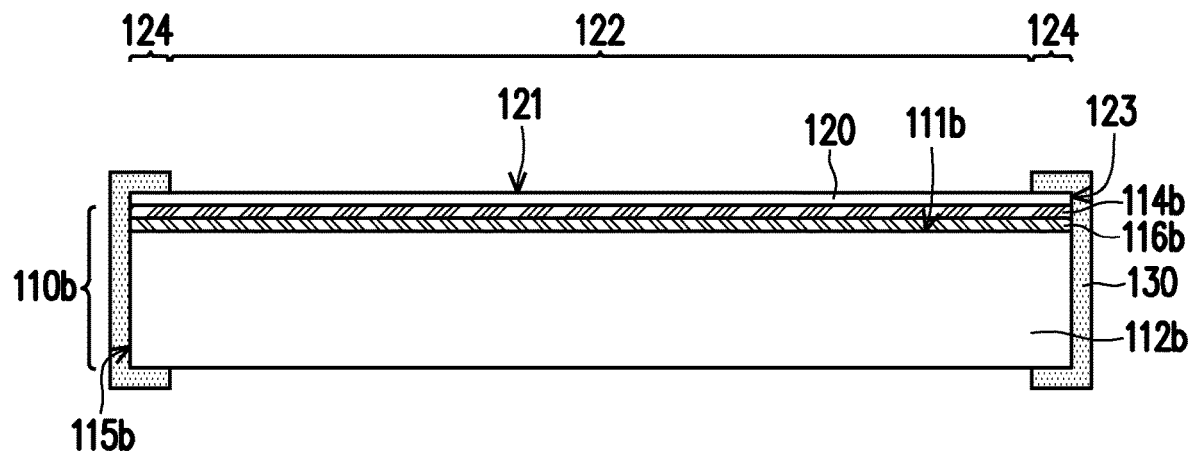

Next, referring to FIG. 3C, the insulating layer 130 is formed to cover the peripheral region 124 of the stainless steel layer 120. The insulating layer 130 extends from the upper surface 121 of the stainless steel layer 120 and covers the side 123 of the stainless steel layer 120 and a side 115b of the first carrier board 110b.

Figure 3D:
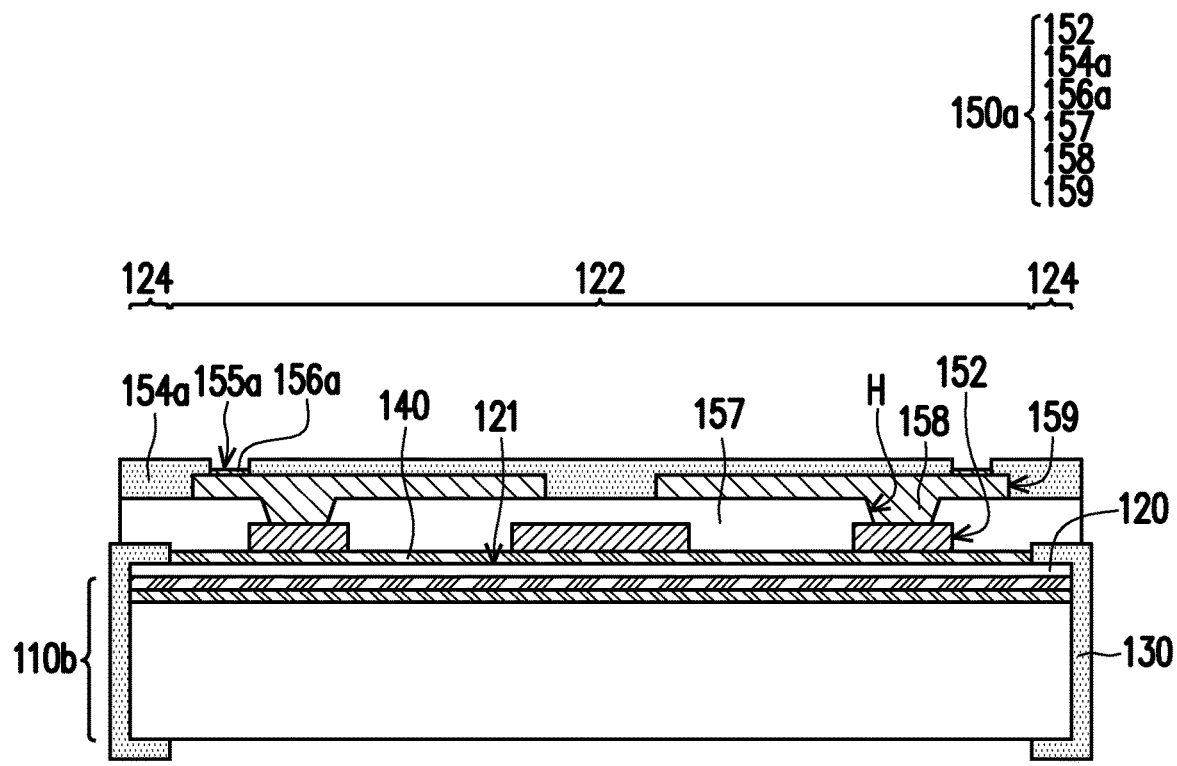

Then, referring to FIG. 3D, the metal layer 140 is first formed on the central region 122 of the stainless steel layer 120, and covers part of the upper surface 121 of the stainless steel layer 120. Next, the first patterned circuit layer 152, the dielectric layer 157, the conductive through holes 158, the second patterned circuit layer 159, the first solder mask layer 154a, and the first surface-treated layer 156a are sequentially formed on the metal layer 140 to complete the manufacturing of the circuit structure layer 150a. Herein, the formation of the first patterned circuit layer 152, the dielectric layer 157, the conductive through holes 158, the second patterned circuit layer 159, the first solder mask layer 154a, and the first surface-treated layer 156a on the metal layer 140 may be referred to the steps of FIG. 2A to FIG. 2B.

Figure 3E:
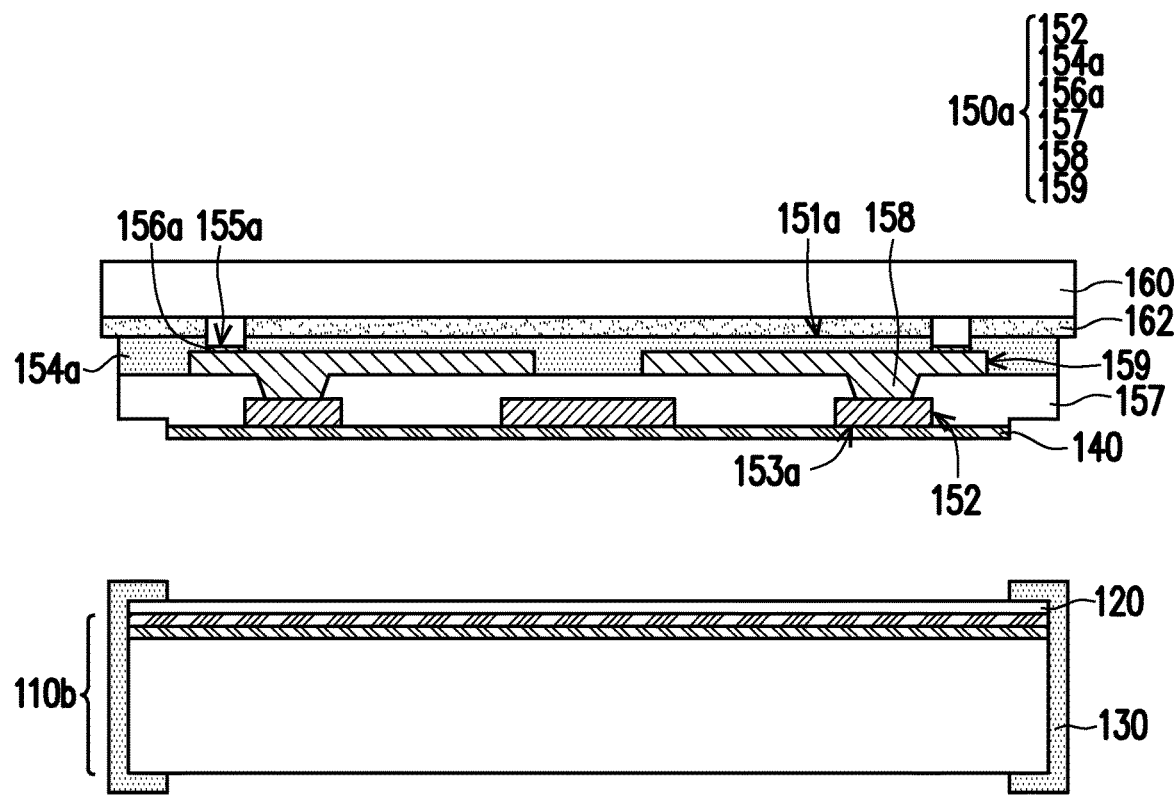

After that, referring to FIG. 3E, the transferring procedure is performed to adhere the top surface 151a of the circuit structure layer 150a onto the adhesive layer 162 of the second carrier board 160. At this time, the circuit structure layer 150a is located between the first carrier board 110b and the second carrier board 160. Next, the first carrier board 110b and the circuit structure layer 150a are separated to transfer the circuit structure layer 150a onto the second carrier board 160, and expose the metal layer 140 on the bottom surface 153a of the circuit structure layer 150a.

Figure 3F:
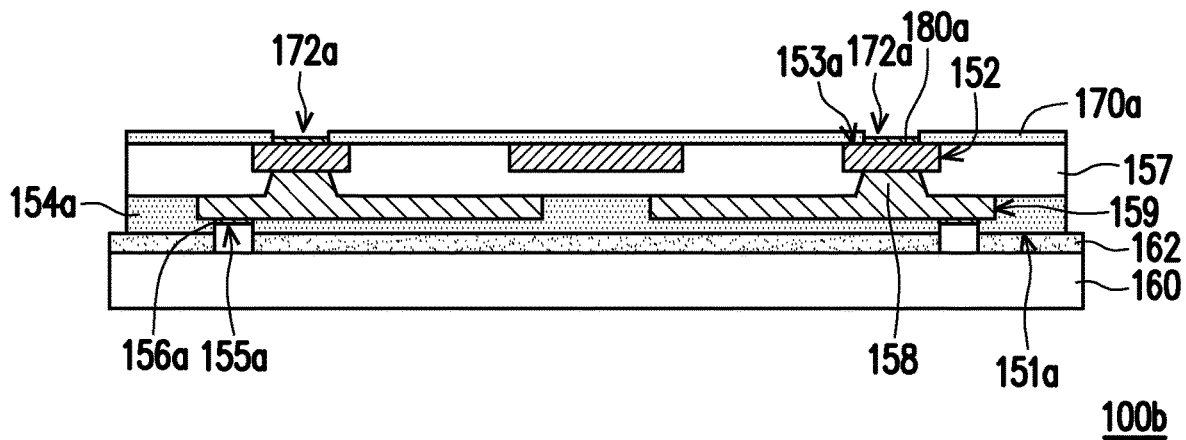

Finally, referring to FIG. 3E and FIG. 3F together, the metal layer 140 is removed to expose the bottom surface 153a of the circuit structure layer 150a. The second solder mask layer 170a is formed on the bottom surface 153a of the circuit structure layer 150a. The second solder mask layer 170a covers the dielectric layer 157 and the first patterned circuit layer 152 and has multiple second openings 172a. The second openings 172a expose part of the first patterned circuit layer 152. The second surface-treated layer 180a is formed on the first patterned circuit layer 152 exposed by the second openings 172a. So far, the manufacturing of the circuit board 100b has been completed.

Briefly speaking, in terms of the manufacturing of the circuit board 100b, first carrier boards 110a and 110b may be the hard board (i.e., including a sheet-shaped or a roll-shaped core substrate) or the flexible board (i.e., the flexible copper clad laminate) or the glass substrate with a titanium layer and a copper layer. In addition, since cutting is not required when separating the first carrier boards 110a and 110b and circuit structure layers 150 and 150a, the first carrier boards 110a and 110b may be reused, thereby effectively saving the manufacturing costs. Moreover, the stainless steel layer 120 formed by sputtering in the embodiments is of a less size and weight compared to the conventional stainless steel board, and may be safer and simpler in terms of operation.

It is worth mentioning that the number of patterned circuit layers of the circuit structure layers 150 and 150a is not limited herein, and may be increased or decreased according to usage requirements, and is not limited thereto.

In summary of the foregoing, in the manufacturing method of a circuit board of the invention, the stainless steel layer is formed on the first conductive layer of the first carrier board by sputtering to achieve the effect of separation between the manufactured product board and the carrier board with the separability property between the stainless steel layer and the metal layer thereon. Moreover, the stainless steel layer formed by sputtering is of a less size and weight compared to the conventional stainless steel board, and may be safer and simpler in terms of operation. Besides, since cutting is not required when separating the first carrier board and the circuit structure layer, the first carrier board may be reused, thereby effectively saving the manufacturing costs. In short, the manufacturing method of a circuit board of the invention is safer and simpler in terms of manufacturing, may effectively reduce the manufacturing costs and improve the product yields.

Lastly, it should be noted that the above embodiments are merely intended for explaining, instead of limiting, the technical solutions of the invention. Although the invention is described in detail with reference to the above embodiments, those of ordinary skill in the art should understand that they can still make modifications to the technical solutions described in the above embodiments or make equivalent substitutions for some or all technical features thereof. The nature of the corresponding technical solutions with such modifications or substitutions does not depart from scope of the technical solutions of the embodiments of the invention.

What is claimed is:

1. A manufacturing method of a circuit board, comprising:
    providing a first carrier board having a substrate and a first conductive layer, the substrate having a first surface, and the first conductive layer being located on the first surface;
    sputtering a stainless steel layer on the first conductive layer, and the stainless steel layer having a central region and a peripheral region surrounding the central region;
    forming an insulating layer to cover the peripheral region of the stainless steel layer, wherein the insulating layer extends from an upper surface of the stainless steel layer and covers both sides of the stainless steel layer and both sides of the first carrier board, and the insulating layer exposes the central region of the stainless steel layer;
    forming a circuit structure layer on the central region exposed by the insulating layer, the circuit structure layer having a top surface and a bottom surface opposite to each other, and the bottom surface being connected to the first carrier board; and
    separating the first conductive layer of the first carrier board and an interface of the stainless steel layer to separate the first carrier board and the circuit structure layer.

2. The manufacturing method of a circuit board according to claim 1, further comprising:
    performing a transferring procedure after forming the circuit structure layer on the central region exposed by the insulating layer to adhere the top surface of the circuit structure layer onto an adhesive layer having been coated on a second carrier board, wherein the transferring procedure includes locating the circuit structure layer between the first carrier board and the second carrier board; and
    separating the first carrier board and the circuit structure layer to transfer the circuit structure layer onto the second carrier board, and expose the bottom surface of the circuit structure layer.

3. The manufacturing method of a circuit board according to claim 1, wherein a material of the substrate comprises a sheet-shaped or a roll-shaped glass fiber resin substrate or a roll-shaped stainless steel substrate.

4. The manufacturing method of a circuit board according to claim 3, wherein the first carrier board further comprises a second conductive layer, the substrate has a second surface opposite to the first surface, the second conductive layer is being located on the second surface, and a material of the first conductive layer and the second conductive layer respectively comprises a copper foil.

5. The manufacturing method of a circuit board according to claim 3, wherein a shape of the substrate being formed to comprise a sheet shape or a roll shape.

6. The manufacturing method of a circuit board according to claim 1, wherein the substrate is a glass substrate, the first carrier board further comprises a second conductive layer, the second conductive layer is being located between the first conductive layer and the substrate, a material of the first conductive layer comprises a copper, and a material of the second conductive layer comprises a titanium.

7. The manufacturing method of a circuit board according to claim 1, further comprising:
    forming a metal layer on the central region of the stainless steel layer after forming the insulating layer to cover the peripheral region of the stainless steel layer and before forming the circuit structure layer on the central region exposed by the insulating layer.

8. The manufacturing method of a circuit board according to claim 7, wherein the step of forming the circuit structure layer on the central region exposed by the insulating layer comprises:
    forming a first patterned circuit layer on the metal layer, and the first patterned circuit layer exposing part of the metal layer;
    forming a first solder mask layer on the first patterned circuit layer, the first solder mask layer covering the metal layer and the first patterned circuit layer and having a plurality of first openings, wherein the first openings expose part of the first patterned circuit layer; and
    forming a first surface-treated layer on the first patterned circuit layer exposed by the first openings.

9. The manufacturing method of a circuit board according to claim 8, further comprising:
    removing the metal layer to expose the bottom surface of the circuit structure layer after separating the first carrier board and the circuit structure layer;

forming a second solder mask layer on the bottom surface of the circuit structure layer, the second solder mask layer covering the first solder mask layer and the first patterned circuit layer and having a plurality of second openings, and the second openings exposing part of the first patterned circuit layer; and forming a second surface-treated layer on the first patterned circuit layer exposed by the second openings.

10. The manufacturing method of a circuit board according to claim 7, wherein the step of forming the circuit structure layer on the central region exposed by the insulating layer comprises:

forming a first patterned circuit layer on the metal layer, and the first patterned circuit layer exposing part of the metal layer;

forming a dielectric layer on the first patterned circuit layer, the dielectric layer covering the metal layer and the first patterned circuit layer and having a plurality of openings, and the openings exposing part of the first patterned circuit layer;

forming a plurality of conductive through holes and a second patterned circuit layer on the dielectric layer, the conductive through holes being located in the openings, the second patterned circuit layer being located on the dielectric layer, and the second patterned circuit layer being electrically connected to the first patterned circuit layer through the conductive through holes;

forming a first solder mask layer on the second patterned circuit layer, the first solder mask layer covering the dielectric layer and the second patterned circuit layer and having a plurality of first openings, and the first openings exposing part of the second patterned circuit layer; and forming a first surface-treated layer on the second patterned circuit layer exposed by the first openings.

11. The manufacturing method of a circuit board according to claim 10, further comprising:

removing the metal layer to expose the bottom surface of the circuit structure layer after separating the first carrier board and the circuit structure layer;

forming a second solder mask layer on the bottom surface of the circuit structure layer, the second solder mask layer covering the dielectric layer and the first patterned circuit layer and having a plurality of second openings, and the second openings exposing part of the first patterned circuit layer; and forming a second surface-treated layer on the first patterned circuit layer exposed by the second openings.

12. The manufacturing method of a circuit board according to claim 1, wherein a thickness of the stainless steel layer is being formed between 0.05 μm and 0.5 μm.

* * * * *